United States Patent [19]

Suzuki

[11] Patent Number: 4,710,651
[45] Date of Patent: Dec. 1, 1987

[54] JOSEPHSON-JUNCTION LOGIC DEVICE

[75] Inventor: Hideo Suzuki, Yokohama, Japan

[73] Assignee: Fujitsu Limited, Kawasaki, Japan

[21] Appl. No.: 917,313

[22] Filed: Oct. 10, 1986

Related U.S. Application Data

[63] Continuation of Ser. No. 735,726, May 20, 1985, abandoned, which is a continuation of Ser. No. 428,481, Sep. 29, 1982, abandoned.

[30] Foreign Application Priority Data

Sep. 30, 1981 [JP] Japan ................... 56-153886

[51] Int. Cl.⁴ .......................... H03K 19/195
[52] U.S. Cl. ................... 307/462; 307/277; 307/306; 357/5
[58] Field of Search ............. 307/462, 476, 306, 271; 357/5; 365/162

[56] References Cited

U.S. PATENT DOCUMENTS

| | | | |
|---|---|---|---|
| 3,978,351 | 8/1976 | Zappe | 307/306 |
| 4,117,354 | 9/1978 | Gheewala | 307/462 |
| 4,149,097 | 4/1979 | Faris | 307/476 |

Primary Examiner—John Zazworsky
Attorney, Agent, or Firm—Staas & Halsey

[57] ABSTRACT

A Josephson-junction logic device comprising at least first and second superconductive loops and at least two logic input signal lines, each of the logic input signal lines arranged opposite to one of the superconductive loops so that each logic input signal line is able to magnetically couple with only one of the superconductive loops and is magnetically independent from the other superconductive loop, whereby the allowable range for maintaining the device in a superconductive state is expanded.

3 Claims, 12 Drawing Figures

JOSEPHSON-JUNCTION LOGIC DEVICE

This is a continuation of co-pending application Ser. No. 735,726 filed on May 20, 1985, now abandoned, which is a contunuation of U.S. application Ser. No. 428,481, filed Sept. 29, 1982, now abandoned.

BACKGROUND OF THE INVENTION

1. Field of the Invention

The present invention relates to a Josephson-junction logic device and more specifically to a Josephson-junction logic gate based on three or more Superconducting Quantum Interference Devices (SQUIDs) of a magnetically-coupled gate type which ensure electrical isolation of the output from the inputs, wherein the margin of operation is improved

2. Description of the Prior Art

Conventional Josephson logic gates comprising multi-junction SQUIDs can be divided into two types, i.e., a type with a magnetically coupled gate having magnetically coupled control lines as disclosed in U.S. Pat. No. 3,978,351 and a type with a current-injection gate in which the input current is allowed to flow directly into a loop of the SQUID as disclosed in U.S. Pat. No. 4,117,354.

In the magnetically coupled-type gate, an input current is fed to the magnetically coupled control lines i.e., the input signal lines, to change the magnetic field coupled with the loop of the SQUID, whereby the critical current of the gate is changed and a superconductive state is switched to a voltage state. In the conventional magnetically coupled gate, however, the input signal lines are arranged so as to be opposite to all the inductances of the superconducting loop. In this construction, the critical current is simply determined by the sum of the input currents supplied to the input signal lines. That is, the critical current is linearly changed with respect to the sum of the input currents. Because of the linear characteristics, there is a disadvantage in that the allowable ranges of the input currents are small, and, therefore, the margin for operation is small.

The current injection-type gate, in which the input current is allowed to flow directly into the loop of the gate, utilizes a phenomenon in which a superconductive state is switched to a voltage state when the input current exceeds a threshold value. In the current injection-type gate, the critical current is not determined simply by the sum of the input currents. Therefore, the current injection-type gate has nonlinear threshold characteristics, and the boundary between a superconductive state and a voltage state changes more rapidly than that of the magnetically coupled gate, making it possible to improve the operation margin as compared with the operation margin of the magnetically coupled-type gate. This type of gate, however, requires magnetically coupled circuits to electrically isolate the inputs from the output. Because the magnetically coupled circuits are a necessity, there are disadvantages in the current injection-type gate in that the size of the current injection-type gate is large.

SUMMARY OF THE INVENTION

It is, therefore, an object of the present invention to increase the allowable range of the input currents of a Josephson-junction logic device of a magnetically-coupled type, including three or more Josephson junctions, without the use of a magnetically coupled circuit for electrically isolating the inputs from the output.

Another object of the present invention is to provide a Josephson-junction logic device of a magnetically-coupled type including three or more Josephson junctions in which a nonlinear relationship exists among the input currents which determine the critical current for switching.

The above objects are attained by a Josephson-junction logic device comprising: at least two superconductive loops, each loop having at least two Josephson-junction elements and an inductance between each of the Josephson-junction elements, the superconductive loops being connected so that two adjacent superconductive loops commonly include one of the Josephson-junction elements; at least two logic input signal lines, each of the logic input signal lines being independently arranged opposite one of the inductances so as to be able to magnetically couple with one of the inductances; and output terminals, for obtaining a logic output signal, connected across one of the Josephson-junction elements.

BRIEF DESCRIPTION OF THE DRAWINGS

The above objects and advantages of, as well as other features of, the present invention will be better understood from the following description with reference to the accompanying drawings, in which.

DESCRIPTION OF THE PREFERRED EMBODIMENTS

The embodiments of the present invention will be described in comparison with the conventional device, with reference to the drawings.

Figure 1A:
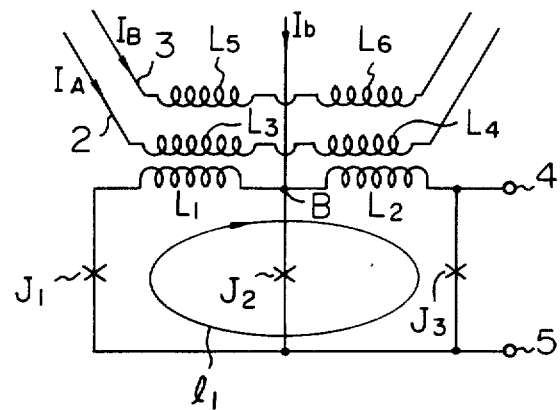
FIG. 1A is a circuit diagram of an example of a conventional Josephson-junction logic AND gate of a magnetically coupled type including three Josephson junctions.

FIG. 1A is a conventional example of a magnetically coupled-type logic AND gate including three Josephson-junction elements hereinafter referred to as Josephson-junctions. In FIG. 1A, the logic AND gate comprises three Josephson-junctions $J_1$, $J_2$, and $J_3$, an inductance $L_1$ between the junctions $J_1$ and $J_2$, an inductance $L_2$ between the junctions $J_2$ and $J_3$, and inductances $L_3$, $L_4$, $L_5$, and $L_6$ which are arranged so as to be opposite the inductances $L_1$ and $L_2$ and magnetically couple with them. The inductances $L_1$ and $L_2$ and the Josephson-junctions $J_1$ and $J_3$ constitute a superconductive loop $l_1$. At a node B between the inductances $L_1$ and $L_2$ in the loop $l_1$, a bias current $I_b$ is supplied. Input currents $I_A$ and $I_B$ are supplied to input signal lines 2 and 3 which include the inductances $L_3$ and $L_4$, and $L_5$ and $L_6$, respectively. When the input currents $I_A$ and $I_B$ are supplied, the inductances $L_3$ and $L_4$ and $L_5$ and $L_6$ produce a magnetic field. Then the superconductive loop $l_1$ is magnetically coupled to the produced magnetic field so that the critical current $I_m$ between a superconductive state and a voltage state of the logic AND gate is changed.

Figure 1B:
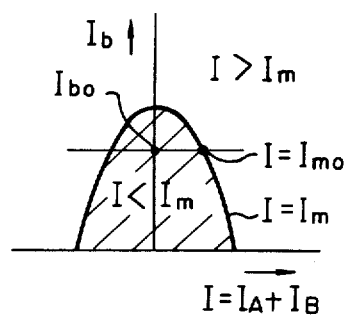
FIG. 1B is a graph of the relationship between the input current and the bias current with respect to the critical current of the gate of FIG. 1A.

FIG. 1B is a graph showing the relationship between the sum of the input currents $I=I_A+I_B$ and the bias current $I_b$ with respect to the critical current $I_m$ of the superconductive loop $l_1$ in the circuit of FIG. 1. In FIG. 1B, when the sum of the input currents $I_A+I_B$ is smaller than the critical current $I_m$, indicated by the hatched areas, the AND gate of FIG. 1A is in a superconductive state so that a voltage does not appear across the output terminals 4 and 5. When the sum of the input currents $I_A+I_B$ is greater than the critical current $I_m$, the gate assumes a voltage state so that a voltage appears across the output terminals 4 and 5. When the bias current $I_b$ is kept constant at $I_{b0}$, the critical current is fixed at $I_{m0}$.

Figure 1C:
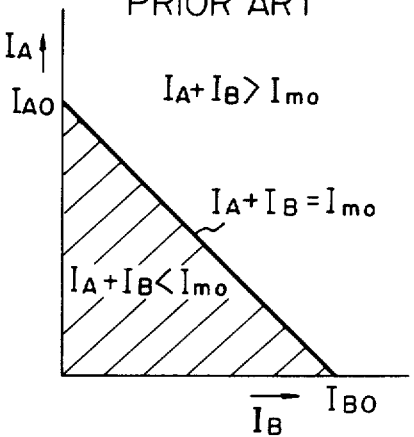
FIG. 1C is a graph of the relationship among the input currents determining the critical current when the bias current is constant in the gate of FIG. 1A

FIG. 1C is a graph of the relationship between the input currents $I_A$ and $I_B$ which determine the critical current $I_{m0}$ in the circuit of FIG. 1A under a condition in which the bias current $I_b$ is kept constant at $I_{b0}$, and, accordingly, the critical current is fixed at $I_{m0}$. In FIG. 1C, when the sum of the input currents $I_A$ and $I_B$ is smaller than the constant critical current $I_{m0}$, indicated by the hatched areas, the AND gate of FIG. 1A is in a superconductive state. When $I_A+I_B$ is greater than $I_{m0}$, the AND gate is in a voltage state. Because the critical current $I_{m0}$ is constant, the characteristic of the relationship between the input currents $I_A$ and $I_B$, which determine the critical current $I_{m0}$, is a linear one. Due to this fact, the allowable range of the input currents to maintain the gate in a superconductive state is narrow, as will be explained in detail later in comparison with the embodiments of the present invention. For example, when $I_B=0$, the gate is switched from a superconductive state to a voltage state when the input current $I_A$ increases over $I_{A0}=I_{m0}$. Also, when $I_A=0$, the gate is switched to a voltage state when the input current $I_B$ increases over $I_{B0}=I_{m0}$. The input current $I_{A0}$ or $I_{B0}$ is so small that the gate is easily switched to a voltage state. This is the reason why the conventional AND gate has a disadvantage of a narrow allowable range with respect to the input currents.

The first embodiment of the present invention will now be described with reference to FIGS. 2A through 2C.

Figure 2A:
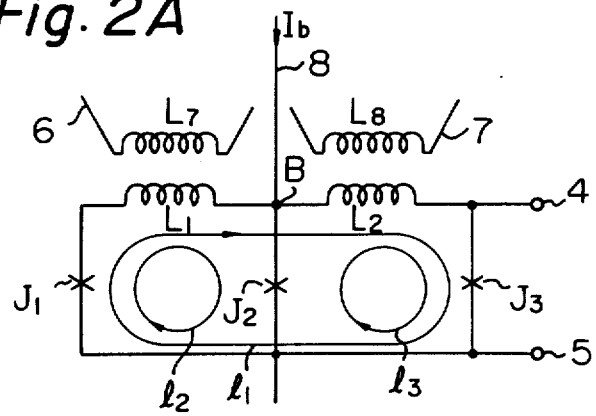
FIG. 2A is a circuit diagram of a Josephson-junction logic AND gate according to a first embodiment of the present invention.
Figure 2B:
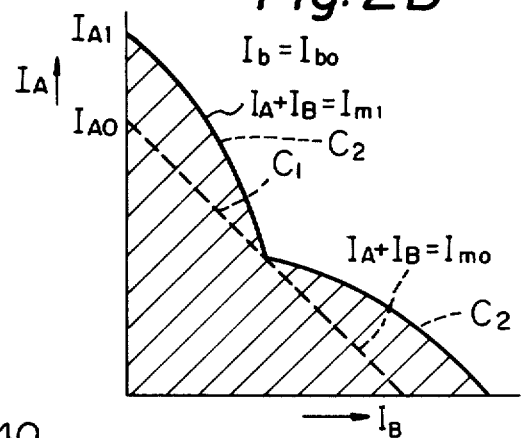
FIG. 2B is a graph of the relationship between the input current and the bias current with respect to the critical current of the gate of FIG. 2A.

In FIGS. 2A, the same portions as those in the circuit of FIG. 1A are denoted by the same reference symbols. FIG. 2A is also a circuit diagram of a Josephson-junction logic AND gate. The difference between FIG. 1A and FIG. 2A is that, in place of the inductances $L_3$ through $L_5$ which are arranged opposite to the inductances $L_1$ and $L_2$ in the loop $l_1$, in FIG. 2A, the inductances $L_7$ and $L_8$ are separately arranged so as to be opposite the inductance $L_1$ and the inductance $L_2$, respectively. By this arrangement, the inductance $L_7$ can be magnetically coupled only to the inductance $L_1$, and the inductance $L_8$ can be magnetically coupled only to the inductance $L_2$. The inductances $L_7$ and $L_8$ are magnetically independent from the inductances $L_2$ and $L_1$, respectively. The inductance $L_1$ and the two Josephson junctions $J_1$ and $J_2$ comprises a superconductive loop $l_2$. The inductance $L_2$ and the two Josephson junctions $J_2$ and $J_3$ comprises another superconductive loop $l_3$. An input current $I_A$ is supplied to an input signal line 6 including the inductance $L_7$. An input current $I_B$ is supplied to an input signal line 7 including the inductance $L_8$. When the inductances $L_1$ and $L_2$ are magnetically coupled with the inductances $L_7$ and $L_8$, respectively, the critical current $I_m$ of the gate of FIG. 2A varies.

Assume that the Josephson junctions $J_1$, $J_2$, and $J_3$ are identical, the inductances $L_1$, $L_2$, $L_7$, and $L_8$ are identical, and the bias current $I_b$ is fixed at a constant value $I_{b0}$ as in FIG. 1A. Then the critical current $I_{ml}$ is not constant as in the conventional gate but varies depending on the input current $I_A$ or $I_B$. Therefore, as illustrated in FIG. 2B by the solid curve $C_2$, the characteristic of the relationship between the input currents $I_A$ and $I_B$, which determine the critical current $I_{ml}$, is a nonlinear one. In FIG. 2B, when $I_A+I_B \leq I_{ml}$, as shown by the hatched area, the gate of FIG. 2A is in a superconductive state, and when $I_A+I_B > I_{ml}$, the gate is in a voltage state. Thus, the circuit of FIG. 2A works as an AND gate. The dashed line $C_1$ in FIG. 2B shows the conventional graph of FIG. 1C. As will be apparent from FIG. 2B, in order to switch the gate to the voltage state by supplying a single current $I_A$ or $I_B$, the current $I_A$ or $I_B$ must be greater than $I_{A1}$ or $I_{B1}$, $I_{A1}$ and $I_{B1}$ being greater than the conventional current $I_{A0}$ and $I_{B0}$, respectively. In other words, when $I_B=0$, the allowable range of the input current $I_A$ to maintain the gate in a superconductive state is increased by $I_{A1}-I_{A0}$ as compared with the conventional gate of FIG. 1A. Also, when $I_A=0$, the allowable range of the input current $I_B$ to maintain the gate in a superconductive state is increased by $I_{B1}-I_{B0}$ as compared with the conventional gate.

The reason why the allowable range of the input currents is expanded is as follows. That is, in FIG. 2A, because the inductance $L_7$ is arranged opposite only to the inductance $L_1$ included in the loop $l_1$, the inducator $L_7$ can only be magnetically coupled with the inductance $L_1$ and is not magnetically coupled with the inductance $L_2$. When the inductance $L_1$ is magnetically coupled with the inductance $L_7$, the phase difference $\phi_{L1}$ across the inductance $L_1$ is changed. In order to satisfy the quantum condition in the loop $l_2$:

$$\phi_{L1}+\phi_{J1}+\phi_{J2}=2n\pi$$

where $\phi_{J1}$ and $\phi_{J2}$ are phase differences across the Josephson junctions $J_1$ and $J_2$ and n is a positive integer, the phase differences $\phi_{J1}$ and $\phi_{J2}$ are changed. Next, in order to satisfy a quantum condition in the loop $l_2$, the phase differences $\phi_{J3}$ and $\phi_{J2}$ of the Josephson junctions $J_3$ and $J_2$, and the inductance $L_2$ are changed. Thus, the inductance $L_2$ and the Josephson junction $J_3$ are indirectly influenced by the input current $I_A$. Due to this indirect influence, a large input current must be supplied to the input signal line 6 for switching the gate from a superconductive state to a voltage state. Similarly, because the inductance $L_8$ is arranged opposite only the inductance $L_2$, a large input current must be supplied to the input signal line 7 for switching the gate. The threshold characteristic is not restricted to the embodiment of FIG. 2B. By selecting an appropriate value of the critical current of each Josephson junction $J_1$, $J_2$, or $J_3$ of the inductance $L_1$, $L_2$, $L_7$, or $L_8$, or of the bias current $I_b$, any desired nonlinear threshold characteristic can be obtained.

Figure 2C:
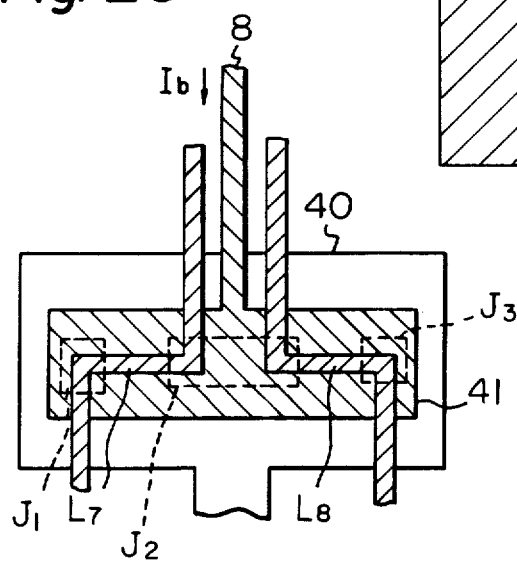
FIG. 2C is a plan view of the physical structure of the gate of FIG. 2A.

FIG. 2C is a plan view of the physical structure of the circuit of FIG. 2A. In FIG. 2C, on a base electrode 40, a counter electrode 41 is formed through an insulating film (not shown). The base electrode 40 and the counter electrode 41 are each composed of a thin superconductive film made of, for example, a lead alloy or the like. The Josephson junctions $J_1$, $J_2$, and $J_3$ are formed by the base electrode 40, the counter electrode 41, and a thin insulating film (not shown) capable of causing superconductive tunneling. The counter electrode 41 is connected to a bias line 8. The input signal line 6 extends so that the inductance $L_7$ is opposite to the inductance $L_1$ of a part of the counter electrode 41 between the Josephson junctions $J_1$ and $J_2$. Similarly, the input signal line 7 extends so that the inductance $L_8$ is opposite to the inductance $L_2$ of the part of the counter electrode 41 between the Josephson junctions $J_2$ and $J_3$. By this arrangement, the inductance $L_7$ is not magnetically coupled directly to the inductance $L_2$, and the inductance $L_8$ is not magnetically coupled directly to the inductance $L_1$. Therefore, the allowable range of the input currents is increased.

The second embodiment of the present invention will now be described with reference to FIGS. 3A through 3D.

Figure 3A:
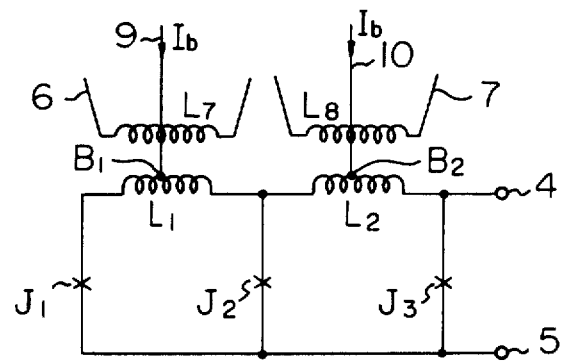
FIG. 3A is a circuit diagram of a Josephson-junction logic AND gate according to a second embodiment of the present invention.

FIG. 3A is a circuit diagram of a Josephson logic AND gate according to the second embodiment of the present invention. The difference between the gates of FIG. 2A and FIG. 3A is that, in FIG. 2A, the single bias line 8 is connected to a point B between the inductances $L_1$ and $L_2$, and, in contrast, in FIG. 3A, two bias lines 9 and 10 are connected to the middle points $B_1$ and $B_2$ of the inductances $L_1$ and $L_2$, respectively.

Figure 3B:
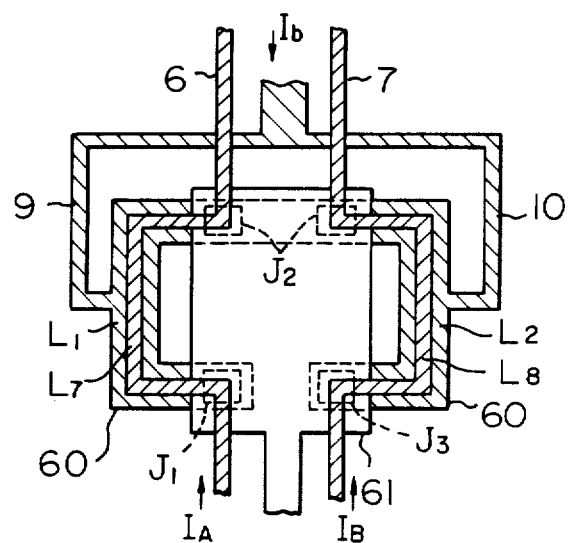
FIG. 3B is a plan view of the physical structure of the gate of FIG. 3A.

FIG. 3B is a plan view of the physical structure of the gate of FIG. 3A. In FIG. 3B, 60 is a base electrode made of lead alloy or the like, and 61 is a counter electrode of superconductive material formed on a part of the base electrode 60 through an insulating film (not shown). The Josephson junctions $J_1$, $J_2$, and $J_3$ are formed at the portions where the insulating film between the base electrode 60 and the counter electrode 61 are so thin that superconductive tunneling is caused therethrough. The part of the base electrode 60 extending on both sides of the counter electrode 61 comprises the inductances $L_1$ and $L_2$. The bias lines 9 and 10 are connected to the middle portions of the inductances $L_1$ and $L_2$. The input signal lines 6 and 7 extend so that their inductances $L_7$ and $L_8$ are opposite to the inductances $L_1$ and $L_2$ and are able to magnetically couple with the inductances $L_1$ and $L_2$. As will be apparent from FIG. 3B, since the inductance $L_7$ is separated from the inductance $L_2$, the inductance $L_7$ is not magnetically coupled directly to the inductance $L_2$. Similarly, the inductance $L_8$ is not magnetically coupled directly to the inductance $L_1$. As a result, the allowable range of the input currents for keeping the gate in a superconductive state is also increased as compared with the conventional example.

Figure 3C:
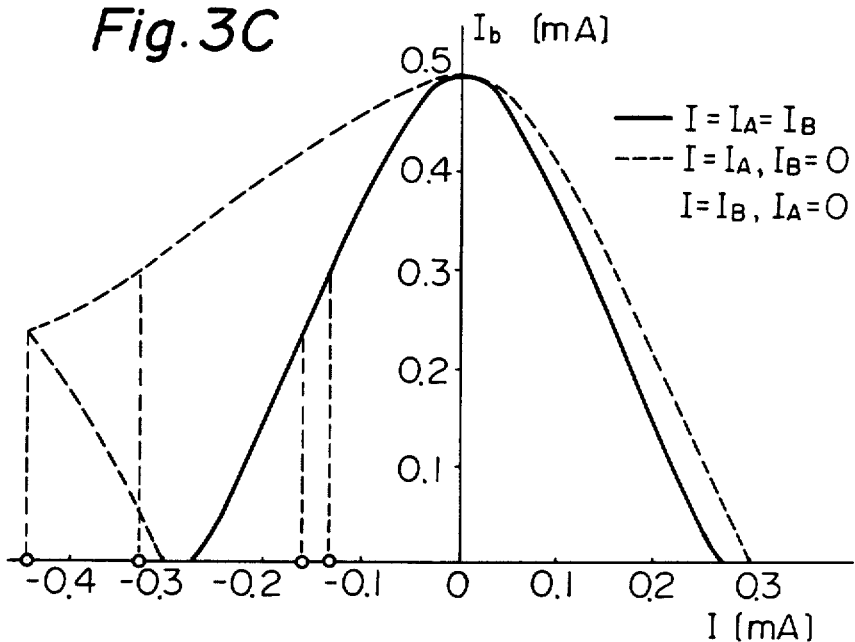
FIG. 3C is a graph of the relationship between the input current and the bias current with respect to the critical current of the gate of FIG. 3A.

FIG. 3C is a theoretical graph of the relationship between the input current and the bias current with respect to the critical current of the gate of FIG. 3A. Assume that the critical current of the Josephson junction $J_1$ or $J_3$ in FIG. 3A is $I_0=0.125$ mA, the inductances $L_1$, $L_2$, $L_7$, and $L_8$ are each 4.14 pH, and the critical current of the Josephson junction $J_2$ in FIG. 3A is $2I_0=0.250$ mA. In FIG. 3C, the abscissa represents the input current $I=I_A$ or $I_B$, and the ordinate represents the bias current $I_b$. The solid curve represents the threshold characteristic when the input current $I_A$ supplied to the input signal line 6 is equal to the input current $I_B$ supplied to the input signal line 7. The dashed curve represents the threshold characteristic when one of the input currents $I_A$ and $I_B$ is zero. Different from the conventional threshold characteristic of FIG. 1B, the threshold characteristic of FIG. 3C depends on the ratio of the input currents $I_A$ and $I_B$. Therefore, even when the bias current $I_b$ is fixed at a constant value, the critical input current for switching the gate of FIG. 3A from a superconductive state to a voltage state is not constant. For example, when the bias current $I_b$ is 0.3 mA, the critical current I is about $-0.13$ mA when the input current $I_A$ is equal to $I_B$, as can be seen from the solid curve, and the critical current I is about $-0.325$ mA when one of the input currents $I_A$ and $I_B$ is zero, as can be seen from the dashed curve. Therefore, when the bias current $I_b$ is fixed at, for example, 0.3 mA, the critical input current I varies from about $-0.13$ mA to about $-0.325$ mA. The negative input current has a direction opposite to the direction of the arrows in FIG. 3A.

Figure 3D:
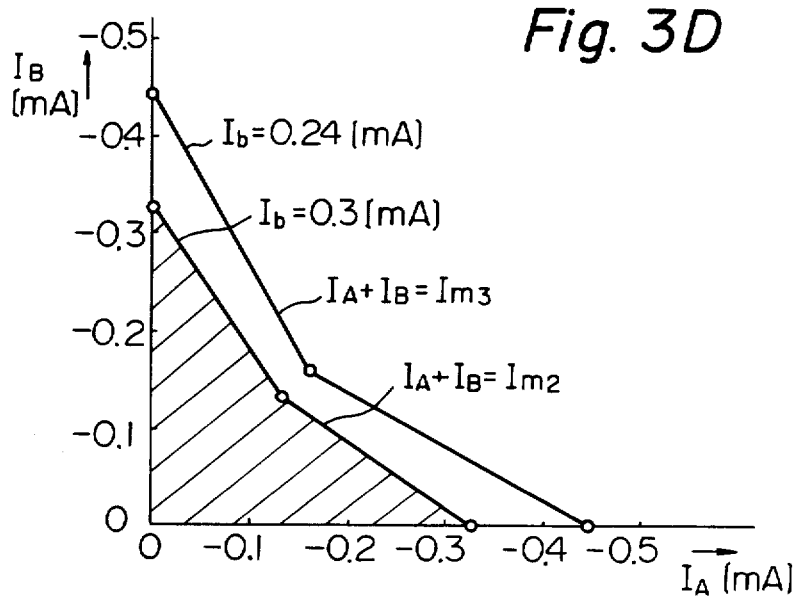
FIG. 3D is a graph of the relationship among the input currents determining the critical current when the bias current is constant in the circuit of FIG. 3A.

FIG. 3D is a graph of the relationship between the input currents $I_A$ and $I_B$ which determine the critical current of the AND gate of FIG. 3A. The abscissa represents the input current $I_A$, and the ordinate represents the input current $I_B$. In FIG. 3D, two threshold curves are illustrated, i.e., the curve when the bias current $I_b$ is 0.3 mA and the curve when the bias current $I_b$ is 0.24 mA. For the purpose of simplicity, these curves are illustrated by straight lines. In practice, however, these curves are similar to the curve of FIG. 2B. It can be confirmed that, in FIGS. 3C and 3D, when the bias current $I_b$ is 0.3 mA, the critical input current $I_A$ or $I_B$ is about $-0.325$ mA when one of the input currents is zero, and the critical input current is about $-0.13$ mA when both input currents are equal. When the input currents $I_A$ and $I_B$ are changed, a threshold curve represented by the expression $I_A+I_B=I_{m2}$ is obtained. It should be noted that the critical current $I_{m2}$ is not constant as in the conventional graph of FIG. 1C but varies depending on the ratio of the input currents $I_A$ and $I_B$. Therefore, the threshold curve of FIG. 3D shows a nonlinear characteristic. When $I_A+I_B<I_{m2}$ as in the hatched area, the AND gate of FIG. 2C is in a superconductive state. When $I_A+I_B>I_{m2}$, the AND gate is in a voltage state.

With respect to the curve expressed by $I_A+I_B=I_{m3}$ in FIG. 3D, which is the threshold curve when the bias current $I_b$ is 0.24 mA, it can also be confirmed that, in FIGS. 3C and 3D, when one of the input currents is zero, the critical current $I_A$ or $I_B$ is about −0.44 mA, and when both input currents are equal, the critical current is about −0.16 mA.

It will be apparent that, according to the second an third embodiments, the allowable range of the input signal for maintaining the gate in a superconductive state is increased as compared with the conventional gate having a linear characteristic.

Figure 4:
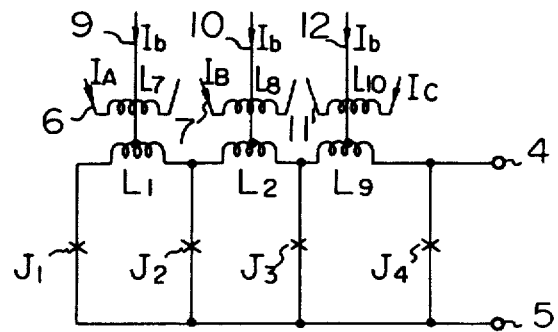
FIG. 4 is a circuit diagram of a Josephson-junction logic AND gate according to a third embodiment of the present invention.

FIG. 4 a is circuit diagram of a three-input Josephson-junction logic AND gate according to a third embodiment of the present invention. The difference between FIG. 3A and FIG. 4 is that, in FIG. 4, there is provided an additional Josephson junction $J_4$ connected between the output terminals 4 and 5, an additional inductance $L_9$ connected between the junctions $J_3$ and $J_4$, an additional inductance $L_{10}$ arranged opposite to the inductance $L_9$, and an additional bias line 11 connected to the middle portion of the inductance $L_9$. By this circuit configuration, a three-input Josephson-junction logic AND gate having a wide allowable range of input currents for maintaining the gate in a superconductive state can be obtained in a manner similar to that in the embodiment of FIG. 3A.

Figure 5:
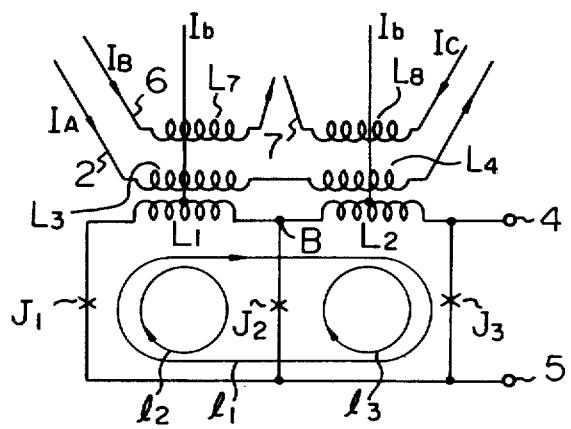
FIG. 5 is a circuit diagram of a Josephson-junction logic gate according to a fourth embodiment of the present invention.

FIG. 5 is a fourth embodiment of the present invention. The difference between FIG. 3A and FIG. 5 is that, in FIG. 5, an additional input signal line 2 is provided. The input line 2 in FIG. 5 is similar to that in the conventional circuit of FIG. 1A and has the inductances $L_3$ and $L_4$. The input line 2 extends between the inductances $L_1$ and $L_7$ and between the inductances $L_2$ and $L_8$ so that the inductances $L_3$ and $L_4$ are able to magnetically couple with both of the inductances $L_1$ and $L_2$. The input signal lines 2, 6, and 7 are supplied with input currents $I_A$, $I_B$, and $I_C$, respectively. Assume that the logic values of the input currents $I_A$, $I_B$, and $I_C$ are A, B, and C, respectively. By selecting appropriate values for the bias current $I_b$ and the input currents $I_A$, $I_B$, and $I_C$, the inductances $L_3$ and $L_7$ opposite to the inductance $L_1$ in the loop $l_2$ can produce a logic sum (A+B), the inductances $L_4$ and $L_8$ opposite to the inductance $L_2$ in the loop $l_3$ can produce a logic sum A+C, and the loops $l_2$ and $l_3$ can produce a logic product (A+B) (A+C). Thus, a logic output $(A+B)(A+C)=A(A+B+C)+B\cdot C=A+B\cdot C$ can be obtained across the output terminals 4 and 5. That is, when the input current $I_A$ is supplied to the input signal line 2 or when the input currents $I_B$ and $I_C$ are supplied to the input signal lines 6 and 7, respectively, or when both of the above situations exist, the gate of FIG. 5 assumes a voltage state.

From the foregoing description, it will be apparent that, according to the present invention, since input signal lines are arranged separately so as to be opposite to the inductances in respective superconductive loops, in a Josephson-junction logic gate comprising multi-junction SQUIDs, in order to switch the gate from a superconducting state to a voltage state, a large input current is necessary as compared with the prior art. Therefore, the effect of an expanded allowable range of the input currents for maintaining the gate in a superconducting state can be obtained. Accordingly, the margin of operation of the Josephson-junction logic gate is improved. Also, since this effect is realized by magnetically coupled-type logic devices, no circuit for isolating the inputs from the output is necessary.

I claim:

1. A Josephson-junction logic device having inductances and forming and AND circuit, comprising:

at least two superconductive loops, each having at least two Josephson-junction elements and a loop inductance connected between each each of said at least two Josephson-junction elements, said at least two superconductive loops being connected so that two adjacent ones of said at least two superconductive loops commonly include one of said at least two Josephson-junction elements, each of said Josephson-junction elements and each loop inductance forming a quantum interference elements;

at least two logic input signal lines, operatively connected to receive input currents, for supplying logic input signals, each of said logic input signal lines being independently arranged to be opposite one loop inductance forming a quantum interference elements, for magnetically coupling with said one loop inductance forming a quantum interference elements;

a bias line, operatively connected to said at least two superconductive loops, for supplying a bias current to said at least two superconductive loops, said bias current satisfying the condition $|I_{ml}| > |I_{mo}|$, where $I_{ml}$ is a first threshold current, for switching said AND circuit, determined when said at least two logic input signal lines receive different magnitude input currents and where $I_{mo}$ is a second threshold current for switching said AND circuit, determined when said at least two logic input signal lines receive the same magnitude input currents; and output terminals, operatively connected ton one of said at least two Josephson-junction elements, for outputting a logic output signal as a result of a logic operation performed on said logic input signals, whereby an operating margin of the AND circuit is expanded.

2. A Josephson-junction logic device as set forth in claim 1, wherein:

said at least two superconductive loops comprise:

a first superconductive loop having a first Josephson-junction element, a second Josephson-junction elements, and a first inductance operatively connected between said first Josephson-junction element and said second Josephson-junction element; and a second superconductive loop, operatively connected to said first superconductive loop, having said second Josephson-junction element, a third Josephson-junction element, and a second inductance operatively connected between said second Josephson-junction element and said third Josephson-junction element; and said at least two logic input signal lines comprise:

a first logic input signal line having a third inductance arranged opposite to said first inductance, for magnetically coupling with said first inductance, aid third inductance being magnetically independent from said second inductance; and A second logic input signal line having a fourth inductance arranged opposite to said second inductance, for magnetically coupling with said second inductance, said fourth inductance being magnetically independent from said first inductance.

3. A Josephson-junction logic device as set forth in claim 2, wherein said bias line comprises:
   a first bias line, operatively connected to a point substantially in the middle of said first inductance, for supplying a bias current to said first superconductive loop; and
   a second bias line, operatively connected to a point substantially in the middle of said second inductance, for supplying a bias current to said second superconductive loop.

* * * * *

UNITED STATES PATENT AND TRADEMARK OFFICE
CERTIFICATE OF CORRECTION

PATENT NO. : 4,710,651

DATED : December 1, 1987    Page 1 of 3

INVENTOR(S) : Hideo SUZUKI

It is certified that error appears in the above-identified patent and that said Letters Patent is hereby corrected as shown below:

```
Column 1, line 6,    "contunuation" should be --continuation--;
          line 17,   after "improved" insert --.--.
Column 2, line 33,   after "type" insert --,--;
          line 41,   after "1A" insert --;--.
Column 3, lines 17, 19, 24 & 32, "1₁" should be --ℓ₁--;
Column 4, lines 10 & 59, "1₁" should be --ℓ₁--;
          line 19,   "comprises" should be --comprise--;
                     "1₂" should be --ℓ₂--;
          line 21,   "comprises" should be --comprise--;
                     "1₃" should be --ℓ₃--;
          line 65,   "1₂" should be --ℓ₂--;
          line 67,   "2n 90" should be --2nπ--.
Column 5, line 4,    "1₂" should be --ℓ₂--;
          line 59,   "J₃are" should be --J₃ are--.
```

UNITED STATES PATENT AND TRADEMARK OFFICE
CERTIFICATE OF CORRECTION

PATENT NO. : 4,710,651

DATED : December 1, 1987

INVENTOR(S) : Hideo SUZUKI

It is certified that error appears in the above-identified patent and that said Letters Patent is hereby corrected as shown below:

Column 7, line 8,   "an" should be --and--;
         line 13,  "a is" should be --is a--;
         line 43,  "$L_3$and" should be --$L_3$ and--;
         line 44,  "$l_2$" should be --$\ell_2$--;
         line 46,  "$l_3$" should be --$\ell_3$--;
         line 47,  "$l_2$ and $l_3$" should be --$\ell_2$ and $\ell_3$--.
Column 8, line 5,   "and" (second occurrence) should be --an--
         line 8,   "each each" should be --each--;
         line 21,  "elements" should be --element--;
         line 37,  "ton" should be --to--;
         line 48,  "elements" should be --element--;
         line 63,  "aid" should be --said--;
         line 65,  "A" should be --a--.

UNITED STATES PATENT AND TRADEMARK OFFICE
CERTIFICATE OF CORRECTION

PATENT NO. : 4,710,651

DATED : December 1, 1987

INVENTOR(S) : Hideo SUZUKI

It is certified that error appears in the above-identified patent and that said Letters Patent is hereby corrected as shown below:

* IN THE DRAWINGS:

FIGS. 2A and 3A
    at the portion of the inductor $L_7$ opposite where the numeral 6 is shown, insert an arrow going into the inductor $L_7$ and label the arrow $I_A$
    at the portion of the inductor $L_8$ opposite where the numeral 7 is shown, insert an arrow going into the inductor $L_8$ and label the arrow $I_B$.

FIG. 2C
    at the leg of portion $L_7$ adjacent the current marked $I_b \downarrow$ and extending parallel to the leg labelled 8, please label this leg 6 with a current $I_A \downarrow$ going in the same direction as $I_b$,
    at the leg of portion $L_8$ adjacent the current marked $I_b \downarrow$ and extending parallel to the leg labelled 8, please label this leg 7 with a current $I_B \downarrow$ going in the same direction as $I_b$.

Signed and Sealed this

Fifth Day of July, 1988

Attest:

DONALD J. QUIGG

*Attesting Officer*      *Commissioner of Patents and Trademarks*